(12) United States Patent
Bratkovski et al.

(10) Patent No.: US 8,008,648 B2
(45) Date of Patent: Aug. 30, 2011

(54) MEMRISTORS WITH INSULATION ELEMENTS AND METHODS FOR FABRICATING THE SAME

(75) Inventors: Alexandre M. Bratkovski, Mountain View, CA (US); Qiangfei Xia, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 5 days.

(21) Appl. No.: 12/509,299

(22) Filed: Jul. 24, 2009

(65) Prior Publication Data

US 2011/0017977 A1   Jan. 27, 2011

(51) Int. Cl.
*H01L 29/06* (2006.01)
(52) U.S. Cl. .......................................... 257/14; 438/900
(58) Field of Classification Search ................. 257/14; 438/900
See application file for complete search history.

(56) References Cited

U.S. PATENT DOCUMENTS

2010/0253997 A1 * 10/2010 Li ................................. 359/319
* cited by examiner

*Primary Examiner* — Jami M Valentine

(57) ABSTRACT

Embodiments of the present invention are directed to nanoscale memristor devices that provide nonvolatile memristive switching. In one embodiment, a memristor device comprises an active region disposed between a first electrode and a second electrode. The device includes a first insulation element disposed between the first electrode and an outer portion of a first surface of the active region. The first insulation element is configured with one or more opening through which the first electrode makes physical contact with the active region. The device also includes a second insulation element disposed between the second electrode and an outer portion of a second surface of the active region. The second insulation element is configured with one or more opening through which the second electrode makes physical contact with the second surface.

8 Claims, 10 Drawing Sheets

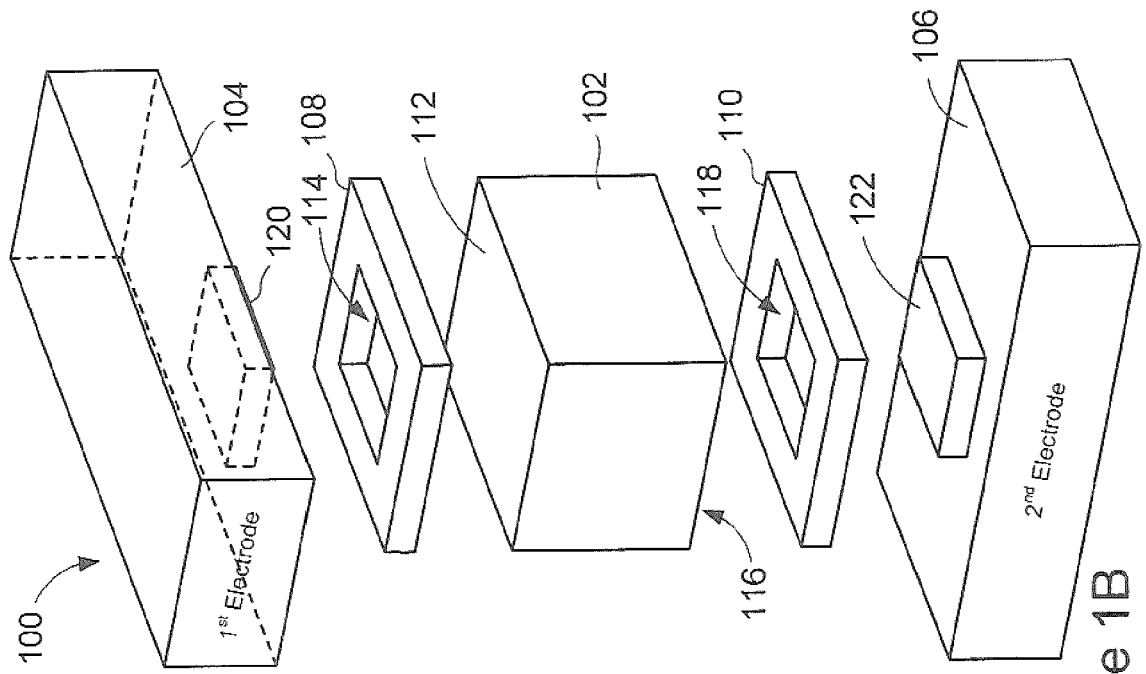
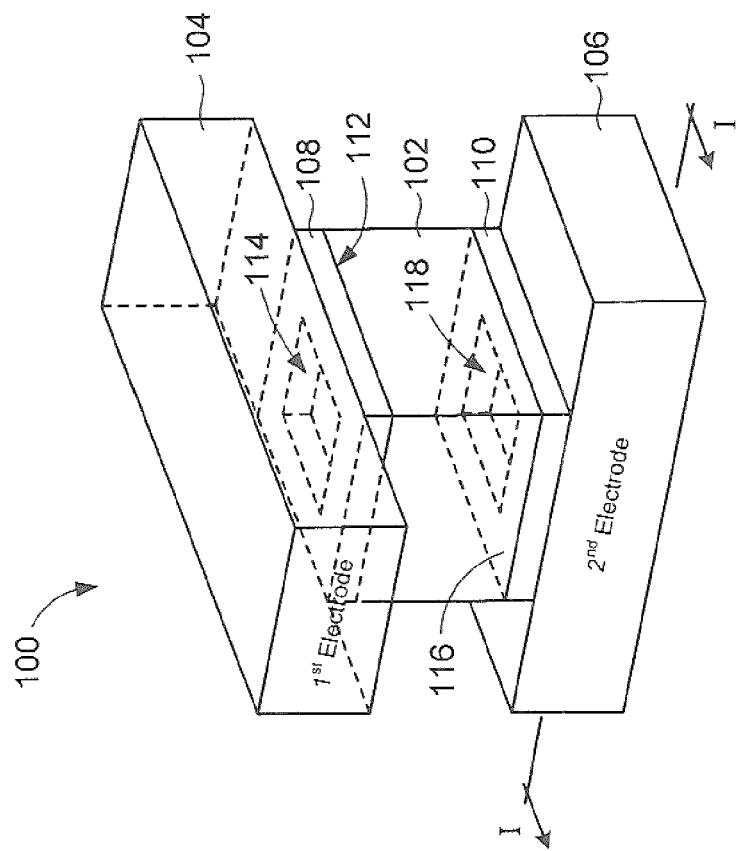
Figure 1B
Figure 1A

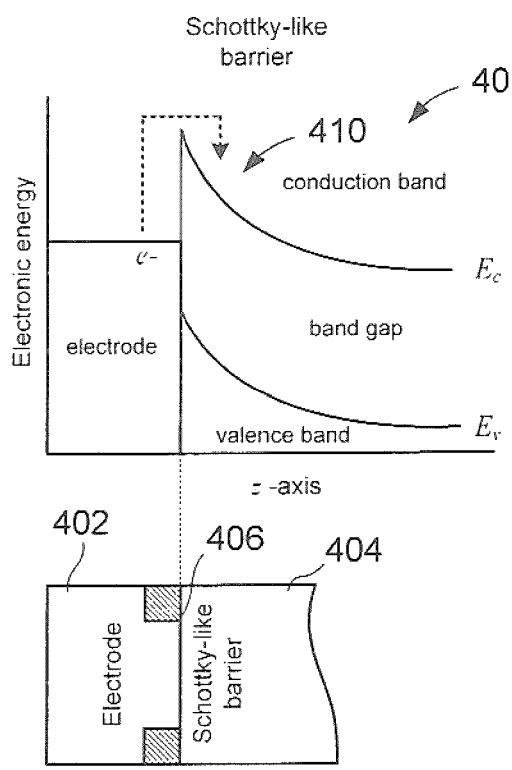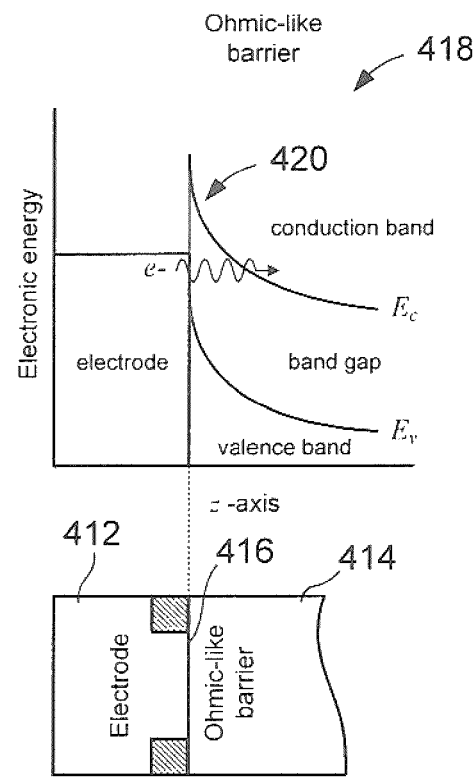
Figure 4A
Figure 4B
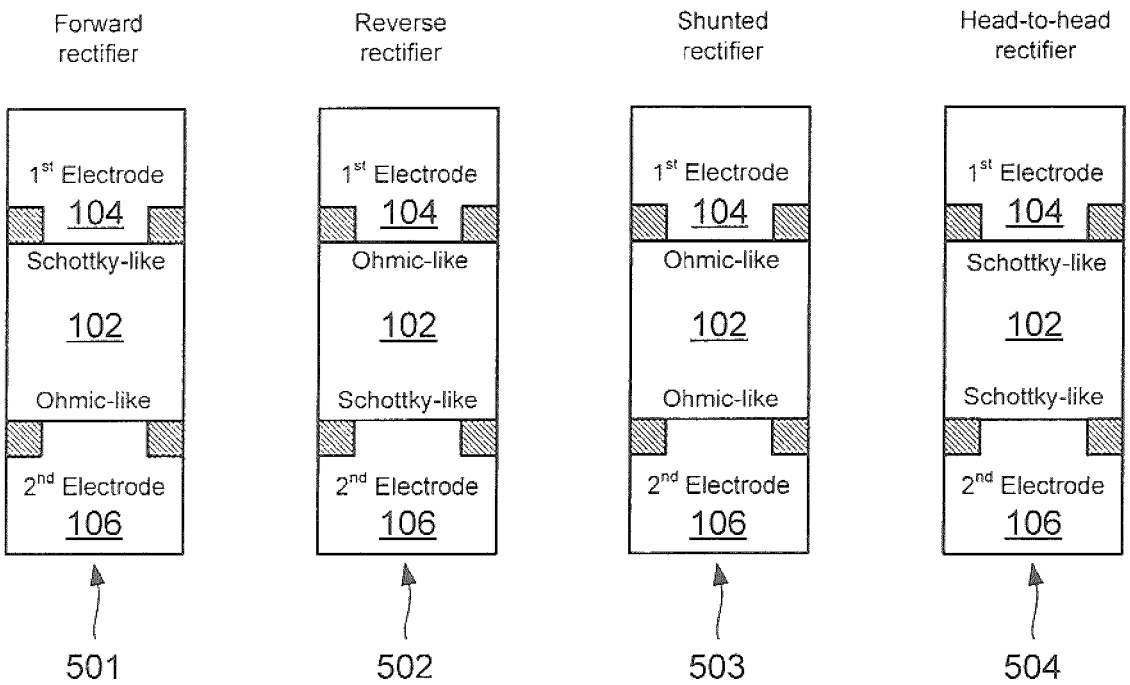
Figure 5

MEMRISTORS WITH INSULATION ELEMENTS AND METHODS FOR FABRICATING THE SAME

TECHNICAL FIELD

Embodiments of the present invention are related to nanoscale memristor devices.

BACKGROUND

Significant research and development efforts are currently directed towards designing and manufacturing nanoscale electronic devices, such as nanoscale memories. Nanoscale electronics promises significant advances, including considerably reduced features sizes and the potential for self-assembly and for other relatively inexpensive, non-photolithography-based fabrication methods. However, the design and manufacture of nanoscale electronic devices present many new challenges when compared with the current state-of-the-art.

Studies of switching in nanometer-scale transition-metal oxide devices have previously reported that these devices could be reversibly switched and had an "on-to-off" conductance ratio of approximately $10^4$. These devices have been used to construct crossbar circuits and provide a promising route for the creation of ultra-high density nonvolatile memory. A series connection of crossbar switches that can be used to fabricate, for example, latch circuit elements has also been demonstrated, which is an important component for logic circuits and for communication between logic and memory. New logic families that can be constructed entirely from crossbar arrays of resistive switches or as hybrid structures composed of resistive switches and transistors have been described. These new logic families have the potential to dramatically increase the computing efficiency of CMOS circuits, thereby enabling performance improvements of orders of magnitude without having to shrink transistors, or to even replace CMOS for some applications if necessary. However, it is desired to improve the performance of these devices.

BRIEF DESCRIPTION OF THE DRAWINGS

FIG. 1A shows an isometric view of a memristor device configured in accordance with embodiments of the present invention.

FIGS. 1B-1E show exploded isometric views of the memristor device, shown in FIG. 1A, configured in accordance with embodiments of the present invention.

FIG. 4A shows an electronic band diagram representing electronic properties of a Schottky-like barrier at an electrode/active region interface in accordance with embodiments of the present invention.

FIG. 4B shows an electronic'band diagram representing electronic properties of an Ohmic-like barrier at an electrode/active region interface in accordance with embodiments of the present invention.

FIG. 5 shows the relative locations of Ohmic-like and Schottky-like barriers associated with four rectifiers formed in a homostructure active region of a memristor device in accordance with embodiments of the present invention.

DETAILED DESCRIPTION

Figure 1D:
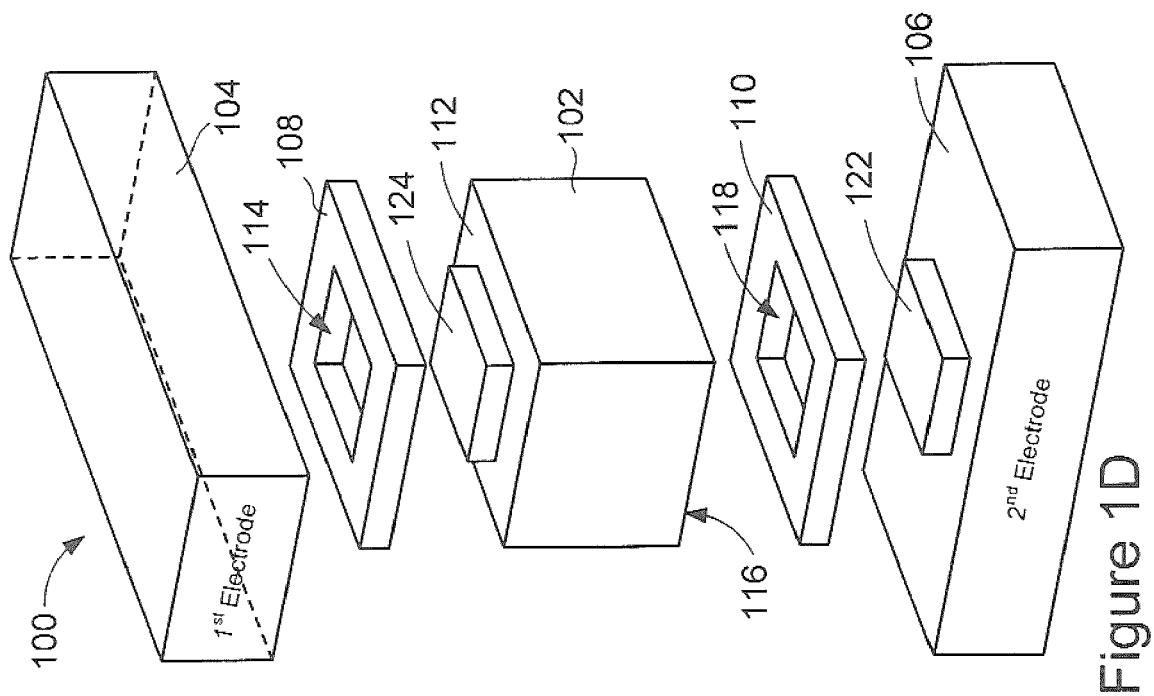

Embodiments of the present invention are directed to nanoscale memristor devices that provide nonvolatile memristive switching. The memristor devices comprise an active region composed of a switching material sandwiched between two electrodes. The devices also include insulation elements disposed between the outer portion of the active region and the electrodes. Each insulation element is composed of an insulation material and is configured to fill the space between the periphery of the active region and one of the electrodes and includes an opening enabling direct contact between the active region and the electrode. When voltages of appropriate magnitudes are applied to the electrodes, the insulation elements channel the resulting electric field toward the center of the active region and away from the outer surfaces of the active region.

The detailed description is organized as follows: A description of electronically actuated memristor devices configured in accordance with embodiments of the present invention is provided in a first subsection. Various materials that can be used to fabricate the memristor devices are provided in a second subsection. A description of two possible ways of switching the rectifying state of a memristor device is provided in a third subsection. An example implementation of memristor devices in crossbar arrays is provided in a fourth subsection. A method for fabricating a memristor device is provided in fifth subsection.

I. An Electronically Actuated Device

FIG. 1A shows an isometric view of a memristor device 100 configured in accordance with embodiments of the present invention. As shown in the example of FIG. 1A, the device 100 includes an active region 102 disposed between a first electrode 104 and a second electrode 106, a first insulation element 108 and a second insulation element 110. The first insulation element 108 is disposed between the first electrode 104 and the outer portion of a first surface 112 of the active region 102. The first insulation element 108 includes an opening 114 through which the first electrode 104 makes physical contact with the active region 102. Like the first insulation element 108, the second insulation element 110 is disposed between the second electrode 106 and the outer portion of a second surface 116, opposite the first surface 112, of the active region 102. The second insulation element 110 also includes an opening 118 through which the second electrode 106 makes physical contact with the active region 102.

In certain embodiments, the electrodes 104 and 106 can be configured with protrusions that extend through the openings 114 and 118 to make contact with surfaces 112 and 116 of the active region 102. FIG. 1B shows an exploded isometric view of the memristor device 100 configured in accordance with a first embodiment of the present invention. As shown in the example of FIG. 1B, the electrode 104 is configured with a protrusion 120 that fits within the opening 114 of the insulation element 108 and establishes contact between the first electrode 104 and the first surface 112 of the active region 102. In addition, the electrode 106 is configured with a protrusion 122 that fits within the opening 118 of the insulation element 110 and establishes contact between the second electrode 106 and the second surface 116 of the active region 102.

Figure 1C:
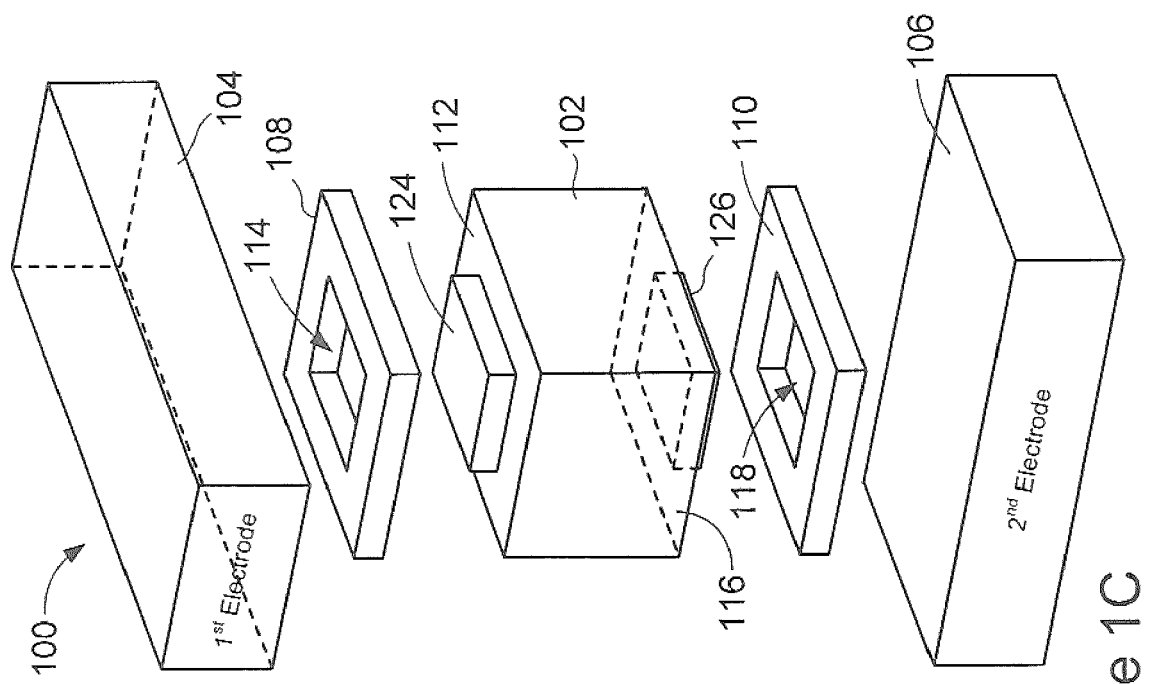

In other embodiments, the active region 102 can be configured with protrusions that extend through the openings 114 and 118 to make contact with the electrodes 104 and 106. FIG. 1C shows an exploded isometric view of the memristor device 100 configured in accordance with a second embodiment of the present invention. As shown in the example of FIG. 1C, the first surface 112 of the active region 102 is configured with a protrusion 124 that fits within the opening 114 of the insulation layer 108 and establishes contact between the active region 102 and the first electrode 104. The second surface 116 is also configured with a protrusion 126 that fits within the opening 118 of the second insulation element 110 and establishes contact between the active region 102 and the second electrode 106.

In still other embodiments, the active region 102 can be configured with a protrusion that fits within an opening an insulation element and an electrode can be configured with a protrusion that fits within an opening of the other insulation element. FIG. 1D shows an exploded isometric view of the memristor device 100 configured in accordance with a third embodiment of the present invention. As shown in the example of FIG. 1D, the protrusion 124 of the active region 116 establishes contact between the first electrode 104 and the active region 102. The protrusion 122 of the second electrode 106 establishes contact between the active region 102 and the second electrode 106.

Figure 1E:
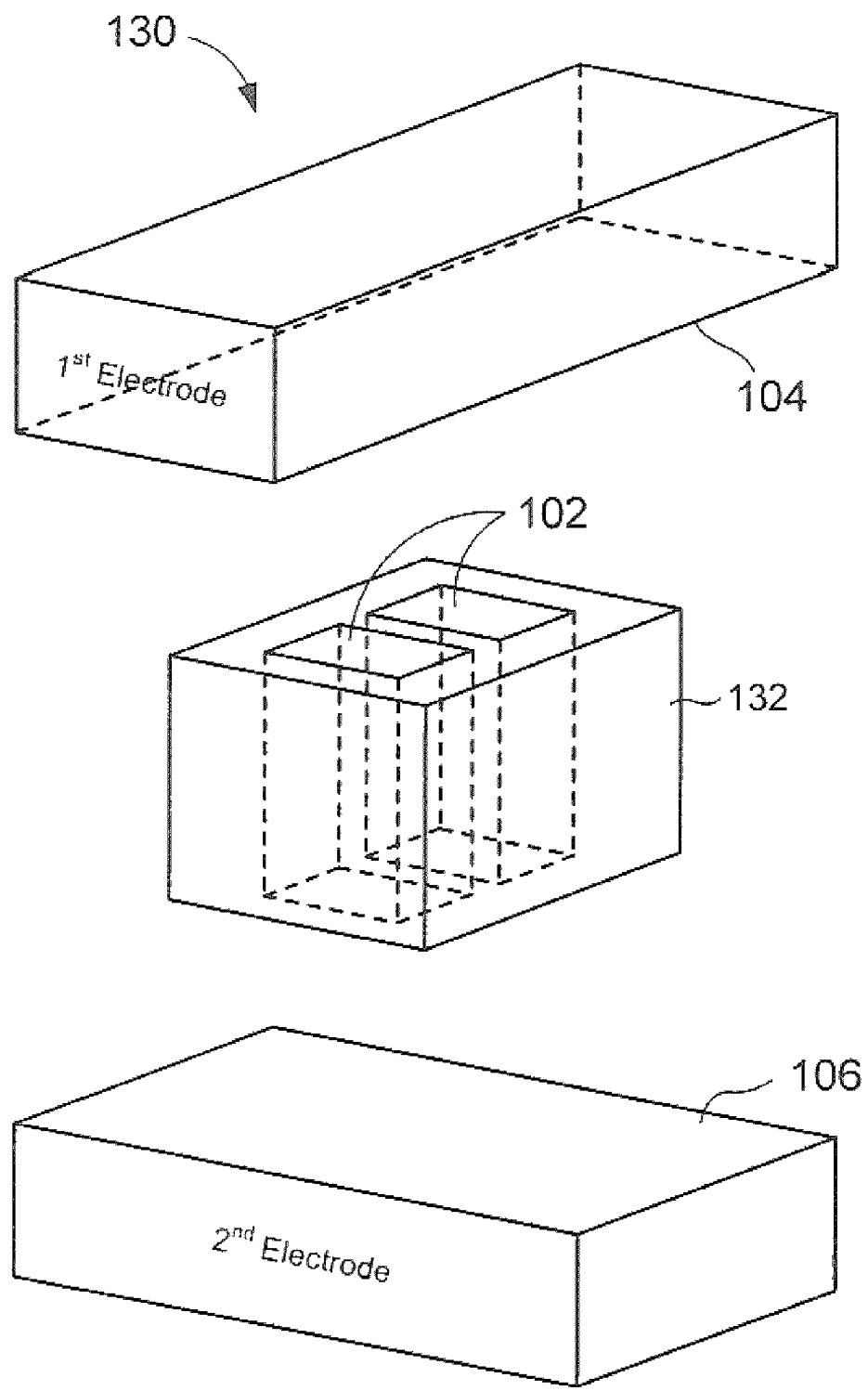

Embodiments of the present invention are not limited to two insulation elements. In other embodiments, the memristor device can be implemented with a single insulation element. FIG. 1E shows an exploded isometric view of a memristor device 130 configured in accordance with embodiments of the present invention. The device 130 includes first and second electrodes 104 and 106, and active regions 102. However, unlike the memristor device 100 embodiments described above, as shown in the example of FIG. 1E, the device 130 includes a single insulation element 132 with two openings in which the active region 102 is disposed. The active region 102 makes physical contact with the first electrode 104 and the second electrode 106. The insulation element 132 spans the distance between the first electrode 104 and the second electrode 106. In other embodiments, the insulation element 132 can be configured with one opening in which a single active region 102 is disposed, or the insulation element can be configured with three or more openings in which three or more active regions 102 are disposed.

Figure 2A:
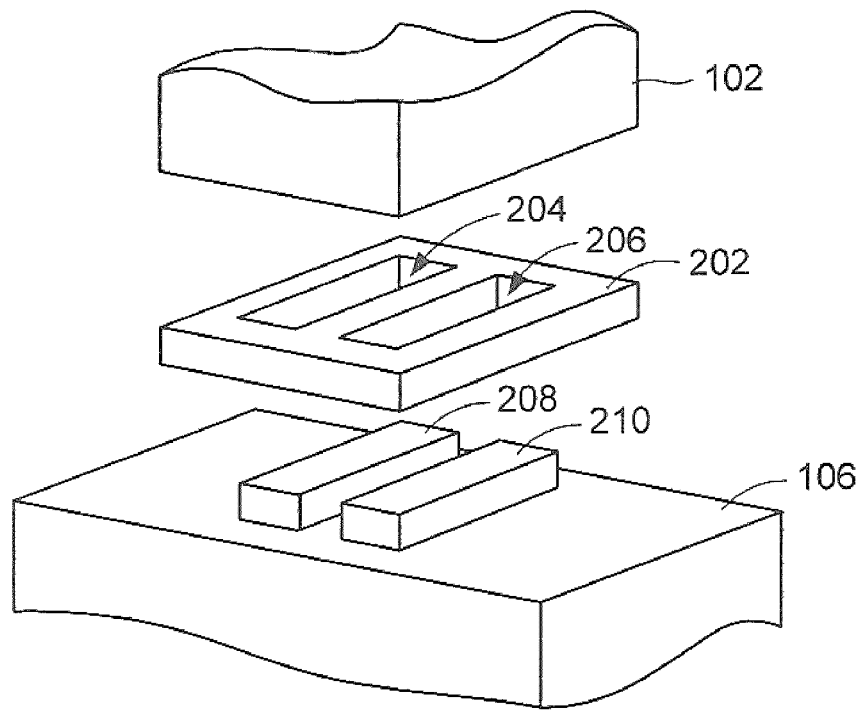
FIGS. 2A-2B show examples of two insulation elements configured in accordance with embodiments of the present invention.
Figure 2B:
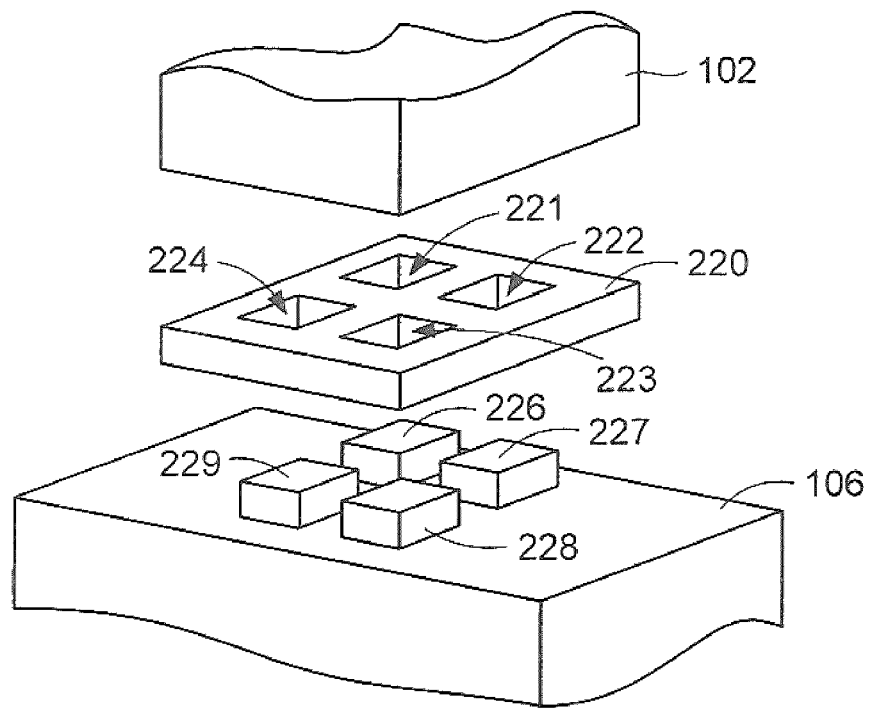

Embodiments of the present invention are not limited to insulation elements with a single opening. In other embodiments, an insulation element can be configured with two, three, or more openings and the corresponding electrode or surface of the active region 102 can be configured with a corresponding number of protrusions that fit within the openings establishing physical contact between the active region and the electrode. FIG. 2A shows an example of an insulation element 202 configured with two openings 204 and 206 in accordance with embodiments of the present invention. The second electrode 106 is also configured with two protrusions 208 and 210 that fit within the openings 204 and 206, respectively, establishing contact between the electrode 106 and the active region 102. FIG. 2B shows an example of an insulation element 220 configured with four openings 221-224 in accordance with embodiments of the present invention. The second electrode 106 is also configured with four protrusions 226-229 that fit within the openings 221-224, respectively, establishing contact between the electrode 106 and the active region 102.

Embodiments of the present invention are also not limited to square- or rectangular-shaped openings within an insulating element, as shown in FIGS. 1-2. In other embodiments, the openings can be triangular, circular, elliptical, irregularly shaped, or any other suitable shape for establishing physical contact between the active region and the electrodes.

Note that for the sake of simplicity, the memristor device 100 shown in FIGS. 1A-1B, is used to describe the operation and composition of the memristor device 100. It should be noted that the memristor device 100 configurations shown and described above with reference to FIGS. 1C, 1D, 2A and 2B can be operated in the same manner and have the same composition.

Figure 3A:
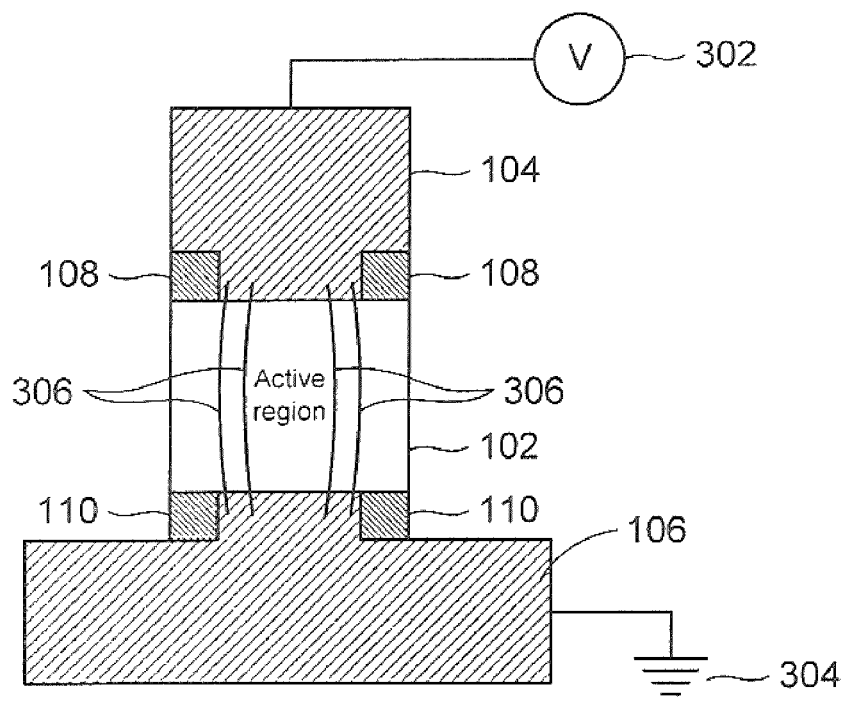
FIG. 3A shows a cross-sectional view of the memristor device along a line I-I, shown in FIG. 1A, in accordance with embodiments of the present invention.

FIG. 3A shows a cross-sectional view of the memristor device 100 along a line I-I, shown in FIG. 1A, in accordance with embodiments of the present invention. The first electrode 104 is connected to a voltage source 302 and the second electrode 106 is connected to a ground 304. Applying a voltage of an appropriate magnitude creates an electric field across the active region 102, as represented by field lines 306. An electric field of an appropriate magnitude can be used to change or reconfigure the dopant concentrations and thereby set the resistance state and operation of the active region 102. Configuring and operating the memristor device 100 is described in greater detail below. In similar memristor devices configured without the insulation elements 108 and 110, when a voltage is applied across the active region 102, the resulting electric field is typically strongest along the edges of the electrodes 104 and 106, which may cause the active region 102 to break down by changing the atomic structure of the active region 102 near the outer surfaces of the active region 102. As a result, conductance channels may form along the periphery of the active region 102 lowering the overall resistance of the active region 102 and may, under certain conditions, render the device inoperable for its intended purpose. On the other hand, including the insulation elements 108 and 110 localizes the strongest portion of the electric field to the approximate center of the active region 102, as represented by field lines 306, creating a localized electric field enhancement and substantially preventing unwanted conductance channels from forming along the outer surface of the active region 102.

Figure 3B:
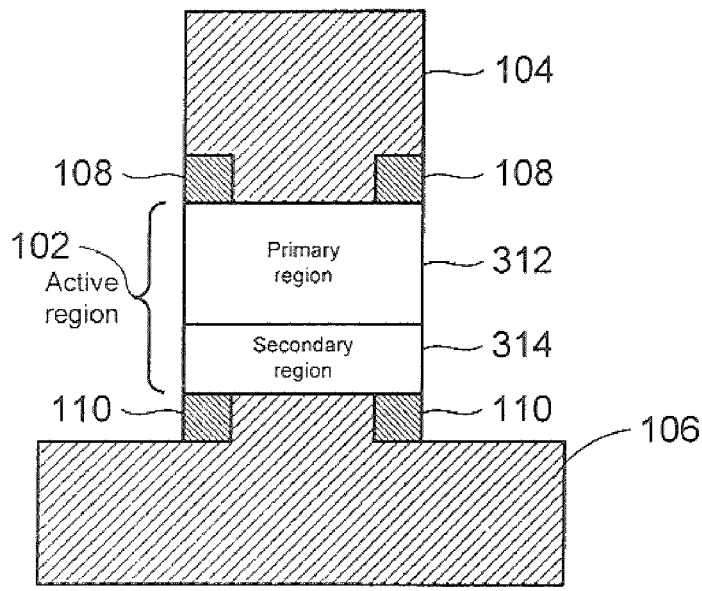
FIG. 3B shows primary and secondary regions of an active region of a memristor device configured in accordance with embodiments of the present invention.

FIG. 3B shows the active region 102 composed of a primary active region or layer 312 and a secondary active region or layer 314 in accordance with embodiments of the present invention. The primary active region 312 comprises a primary active material that is electronically semiconducting or nominally electronically insulating and can also be a weak ionic conductor. The primary active material is capable of transporting dopants that control the flow of charge carriers or current through the device 100. On the other hand, the material comprising the secondary active region 314 typically comprises a film within the active region 102 that is a source of dopants for the primary active material. These dopants may be impurity atoms that act as electron donors or electron acceptors for the primary active material. Alternatively, the dopants can be anion vacancies or cation interstitials, which in the primary active material are charged and therefore are also electron donors for the lattice of the active region 102. It is also possible to drive the anions into the primary active material, which become electron acceptors or hole donors.

The basic mode of operation of the memristor device 100 is to apply a voltage of an appropriate magnitude to generate a corresponding electrical field of an appropriate magnitude and polarity across the active region 102, as described above with reference to FIG. 3A. When the magnitude and polarity of the electrical field, also called a "drift field," exceeds a threshold, the dopants become mobile in the primary active material, and the dopants can drift into or out of the primary active material via ionic transport from the secondary active material. The ionic species are specifically chosen from those that act as electrical dopants for the primary active material, and thereby change the resistance of the primary active material. For example, applying a drift field that introduces dopants from the secondary active material into the primary active material lowers the resistance of the primary active material, while applying a drift field that drives dopants from the primary active material into the secondary active region 314 increases the resistance of the primary active material. In addition, the primary active material and the dopants are chosen such that the drift of the dopants into or out of the primary active material is possible but not too facile that dopants can diffuse into or out of the primary active material when no voltage is applied. Some diffusion resistance is required to ensure that the active region 102 remains in a particular resistance state for a reasonable period of time, perhaps for many years at the operation temperature. This ensures that the active region 102 is nonvolatile because the active region 102 retains its resistance state even after the drift field has been removed. Applying a drift field with a large enough magnitude causes both electron current and dopants to drift, whereas applying operating voltages with lower relative voltage magnitudes than the drift field causes negligible dopant drift enabling the device to retain its resistance state during operation.

The memristor device 100 is a memristor because the resistance changes in a nonvolatile fashion depending on the magnitude and polarity of an electric field applied in the device 100. Memristance is a nonvolatile, charge-dependent resistance denoted by M (q). The term "memristor" is short for "memory resistor." Memristors are a class of passive circuit elements that maintain a functional relationship between the time integrals of current and voltage, or charge and flux, respectively. This results in resistance varying according to the device's memristance function. Specifically engineered memristors provide controllable resistance useful for switching current. The definition of the memristor is based solely on fundamental circuit variables, similar to the resistor, capacitor, and inductor. Unlike those more familiar elements, the necessarily nonlinear memristors may be described by any of a variety of time-varying functions. As a result, memristors do not belong to Linear Time-Independent circuit models. A linear time-independent memristor is simply a conventional resistor.

A memristor is a circuit element in which the 'magnetic flux' (defined as an integral of bias voltage over time) $\Phi$ between the terminals is a function of the amount of electric charge q that has passed through the device. Each memristor is characterized by its memristance function describing the charge-dependent rate of change of flux with charge as follows:

$$M(q) = \frac{d\Phi}{dq}$$

Based on Faraday's law of induction that magnetic flux $\Phi$ is the time integral of voltage, and charge q is the time integral of current, the memristance can be written as $$M(q) = \frac{V}{I}$$

Thus, as stated above, the memristance is simply nonvolatile charge-dependent resistance. When M(q) is constant, the memristance reduces to Ohm's Law R=V/I. When M(q) is not constant, the equation is not equivalent to Ohm's Law because q and M(q) can vary with time. Solving for voltage as a function of time gives:

$$V(t)=M[q(t)]I(t)$$

This equation reveals that memristance defines a linear relationship between current and voltage, as long as charge does not vary. However, nonzero current implies instantaneously varying charge. Alternating current may reveal the linear dependence in circuit operation by inducing a measurable voltage without net charge movement, as long as the maximum change in q does not cause change in M. Furthermore, the memristor is static when no current is applied. When I(t) and V(t) are 0, M(t) is constant. This is the essence of the memory effect.

The primary active material can be single crystalline, polycrystalline, nanocrystalline, nanoporous, or amorphous. The mobility of the dopants in nanocrystalline, nanoporous or amorphous materials, however, may be much higher than in bulk crystalline material, since drift can occur through grain boundaries, or through local structural imperfections in a nanocrystalline, nanoporous, or amorphous material. Also, because the primary active material is relatively thin, the amount of time needed for dopants to drift into or out of the primary active material enables the primary active materials conductivity to be rapidly changed. For example, the time needed for a drift process varies as the square of the distance covered, so the time to drift one nanometer is one-millionth of the time to drift one micrometer.

The primary active region 312 and the secondary active region 314 are contacted on either side by conducting/semiconducting electrodes 104 and 106, or one of the electrodes can be composed of a semiconductor material and the other a conducting material. When the active region 102 is composed of a semiconductor material, the contact between a metallic electrode and the active region 102 depletes the active region 102 of free charge carriers. Thus, the net charge of the active region 102 depends on the identity of the dopant and is positive in the case of electron donors and negative in the case of electron acceptors.

The ability of the dopant to drift in and out of the primary active material may be improved if one of the interfaces connecting the active region 102 to a metallic or semiconductor electrode is non-covalently bonded. Such an interface may be composed of a material that does not form covalent bonds with the adjacent electrode, the primary active material, or both. This non-covalently bonded interface lowers the activation energy of the atomic rearrangements that are needed for drift of the dopants in the primary active material.

One potentially useful property of the primary active material is that it can be a weak ionic conductor. The definition of a weak ionic conductor depends on the application for which the memristor device 100 is intended. The mobility $\mu_d$ and the diffusion constant D for a dopant in a lattice are related by the Einstein equation:

$$D = \mu_d kT$$

where k is Boltzmann's constant, and T is absolute temperature. Thus, if the mobility $\mu_d$ of a dopant in a lattice is high so is the diffusion constant D. In general, it is desired for the active region 102 of the device 100 to maintain a particular resistance state for an amount of time that may range from a fraction of a second to years, depending on the application. Thus, it is desired that the diffusion constant D be low enough to ensure a desired level of stability, in order to avoid inadvertently turning the active region 102 from one resistance state to another resistance state via ionized dopant diffusion, rather than by intentionally setting the state of the active region 102 with an appropriate voltage. Therefore, a weakly ionic conductor is one in which the dopant mobility Pd and the diffusion constant D are small enough to ensure the stability or non-volatility of the active region 102 for as long as necessary under the desired conditions. On the other hand, strongly ionic conductors would have relatively larger dopant mobilities and be unstable against diffusion. Note that this relation breaks down at high field and the mobility becomes exponentially dependent on the field.

II. Memristor Device Composition

Embodiments of the present invention are directed to memristor devices with active regions composed of various semiconductor materials in combination with a variety of different electrode compositions. These combinations of materials provide a large engineering space from which memristor devices can be fabricated, are compatible with common CMOS devices, and can be fabricated using various semiconductor fabrication techniques.

The active region 102 can be composed of an elemental and/or compound semiconductor. Elemental semiconductors include silicon (Si), germanium (Ge), and diamond (C). Compound semiconductors include group IV compound semiconductors, III-V compound semiconductors, and II-VI compound semiconductors. Group IV compound semiconductors include combinations of elemental semiconductors, such as SiC and SiGe. III-V compound semiconductors are composed of column Ma elements selected from boron (B), aluminum (Al), gallium (Ga), and indium (In) in combination with column Va elements selected from nitrogen (N), phosphorus (P), arsenic (As), and antimony (Sb). III-V compound semiconductors are classified according to the relative quantities of III and V elements, such as binary compound semiconductors, ternary compound semiconductors, quaternary compound semiconductors. The active region 102 can be composed of other types of suitable compound semiconductors including II-VI ternary alloy semiconductors and II-V compound semiconductors.

The dopants in the secondary active region 314 can be p-type impurities, which are atoms that introduce vacant electronic energy levels called "holes" to the electronic band gaps of the active region. These dopants are also called "electron acceptors." In still other embodiments, the dopants in the secondary active layer 314 can be n-type impurities, which are atoms that introduce filled electronic energy levels to the electronic band gap of the active region. These dopants are called "electron donors." For example, boron (B), Al, and Ga are p-type dopants that introduce vacant electronic energy levels near the valence band of the elemental semiconductors Si and Ge; and P, As, and Sb are n-type dopants that introduce filled electronic energy levels near the conduction band of the elemental semiconductors Si and Ge. In III-V compound semiconductors, column VI elements substitute for column V atoms in the III-V lattice and serve as n-type dopants, and column II elements substitute for column III atoms in the III-V lattice to form p-type dopants.

The primary active material can be composed of an oxide, and the second active region can be composed of a material that forms anion vacancies. The active region 102 can be composed of oxides that contain one or more (mobile) oxygen atom ("O") and one or more other element. In particular, the active region 102 can be composed of titania ("$TiO_2$"), zirconia ("$ZrO_2$"), or hafnia ("$HfO_2$"). These materials are compatible with silicon ("Si") integrated circuit technology because they do not create doping in the Si. Other composition embodiments for the active region 102 include alloys of these oxides in pairs or with all three of the elements Ti, Zr, and Hf present. For example, the active region 102 can be composed of $Ti_xZr_yHf_zO_2$, where x+y+z=1. Related compounds include titanates, zirconates, and hafnates. For example, titanates includes $ATiO_3$, where A represents one of the divalent elements strontium ("Sr"), barium ("Ba") calcium ("Ca"), magnesium ("Mg"), zinc ("Zn"), and cadmium ("Cd"). In general, the active region 102 can be composed of $ABO_3$, where A represents a divalent element and B represents Ti, Zr, and Hf. The active region 102 can also be composed of alloys of these various compounds, such as $Ca_aSr_b Ba_cTi_xZr_yHf_zO_3$, where a+b+c=1 and x+y+z=1. There are also a wide variety of other oxides of the transition and rare earth metals with different valences that may be used, both individually and as more complex compounds. In each case, the mobile dopant is an oxygen vacancy, denoted by $V_O$. An oxygen vacancy effectively acts as a positively charged n-type dopant with one shallow and one deep energy level. Because even a relatively minor nonstoichiometry of about 0.1% oxygen vacancies in $TiO_2$, is approximately equivalent to $5 \times 10^{19}$ dopants/cm$^3$, modulating oxygen vacancy profiles have a strong effect on electron transport.

The insulation elements 108 and 110 can be composed of $SiO_2$, $Al_2O_3$, glass, quartz, a dielectric polymer, or any other suitable dielectric material.

In addition to the large variety of combinations of semiconductor materials and oxides and suitable dopants comprising the active region 102, the electrodes 104 and 106 can be composed of platinum ("Pt"), gold ("Au"), copper ("Cu"), tungsten ("W"), or any other suitable metal, metallic compound (e.g. some perovskites with or without dopants such as $BaTiO_3$ and $Ba_{1-x}La_xTiO_3$, $PrCaMnO_3$) or semiconductor. The electrodes 104 and 106 can also be composed of metallic oxides or nitrides, such as $RuO_2$, $IrO_2$, and TiN. The electrodes 104 and 106 can also be composed of any suitable combination of these materials. For example, in certain embodiments, the first electrode 104 can be composed of Pt, and the second electrode 106 can be composed Au. In other embodiments, the first electrode 104 can be composed of Cu, and the second electrode 106 can be composed of IrO$_2$. In still other embodiments, the first electrode 104 can be composed of a suitable semiconductor, and the second electrode 106 can be composed of Pt.

III. Nonvolatile Switching of the Memristor Device

Depending on the composition of a memristor device, as described above in subsection II, the resistivity of the memristor device can be controlled in at least two different ways. For certain memristor device compositions, switching the resistance of the memristor device may be controlled at the active region/electrode interfaces in a switching process called "interface switching" described below in subsection III.A. For other memristor device compositions, the electronic barriers at the interfaces may be relatively small and contribute little to the device resistance. With these compositions, resistance switching may be performed within the bulk materials of the active region in a process called "bulk switching" described below in subsection III.B.

A. Interface Switching

In interface switching, a memristor device 100 configured as described above in subsection II can also be operated as a forward rectifier, a reverse rectifier, a shunted rectifier, or a head-to-head rectifier as described below by applying an electrical field of an appropriate magnitude and polarity across the active region 102. Nonvolatile switching between different types of rectifiers can be performed by positioning a dopant within the active region 102 to form Ohmic and Schottky barriers to control the flow of charge carriers through the active region 102. However, the traditional description of electrode/semiconductor Schottky and Ohmic barriers does not apply to a nanoscale memristor device 100 because the materials comprising the electrodes 104 and 106 and the active region 102 are structured at the nanoscale. As a result, the structural and electronic properties are not averaged over the large distances for which the theory of metal-semiconductor contacts are developed. Instead, the electronic properties of undoped electrode/active region interfaces can electronically resemble Schottky barriers and are called "Schottky-like barriers," and the electronic properties of doped electrode/active region interfaces electronically resemble Ohmic barriers and are called "Ohmic-like barriers."

Dopants are selectively positioned within the active region 102 to control the flow of charge carriers through the device. In particular, conduction of electrons from an electrode into the active region 102 may occur via quantum mechanical tunneling through an Ohmic-like barrier. FIG. 4A shows an electronic band diagram that represent the electronic properties of a Schottky-like barrier at an electrode 402/active region 404 interface 406 in accordance with embodiments of the present invention. FIG. 4A includes a band diagram 408 representing variations in valence and conduction bands associated with a Schottky-like barrier. When the active region 404 near the electrode 402 has a low dopant concentration or is essentially intrinsic, the tunneling barrier is a Schottky-like barrier 410, which can be characterized as high and wide, effectively preventing electrons from readily tunneling into the conduction band of the active region 404, but electrons may have enough thermal energy to go over the barrier 410. Thus, the conductivity through the active region 404 is low and the memristor device 100 is said to be in an "off" state. On the other hand, FIG. 4B shows an electronic band diagram that represent the electronic properties of an Ohmic-like barrier at an electrode 412/active region 414 interface 416 in accordance with embodiments of the present invention. FIG. 4B includes a band diagram 418 representing variations in valence and conduction bands associated with an Ohmic-like barrier in accordance with embodiments of the present invention. Band diagram 418 represents the case where a sufficient number of dopants have been moved into the active region 414 near the electrode 412. As a result, the tunneling barrier is an Ohmic-like barrier 420 and the width and perhaps the height of the tunneling barrier are diminished such that electrons can tunnel from the electrode 412 into the conduction band of the active region 414, which results in an increase in conductivity, and the device 100 is said to be in an "on" state.

FIG. 5 shows the relative locations of Ohmic-like and Schottky-like barriers associated with each of four rectifiers that can be formed in a homostructure active region of a memristor device in accordance with embodiments of the present invention. A forward rectifier 501 and a reverse rectifier 502 have Ohmic-like barriers and Schottky-like barriers located at opposite interfaces. A shunted rectifier 503 is characterized by having dopants located at or near both interfaces creating Ohmic-like barriers at both interfaces. On the other hand, a head-to-head rectifier 504 is characterized by having the dopants distributed within the active region 102 leaving Schottky-like barriers at both interfaces. Each of the four rectifiers represents a different distribution of dopants. Application of voltages with an appropriate polarity and magnitude can be used to move the dopants and switch the memristor device between the different rectifiers. The memristor device can then be operated as a particular rectifier by applying voltages that do not exceed the voltage threshold used to switch the rectifier state.

Figure 6:
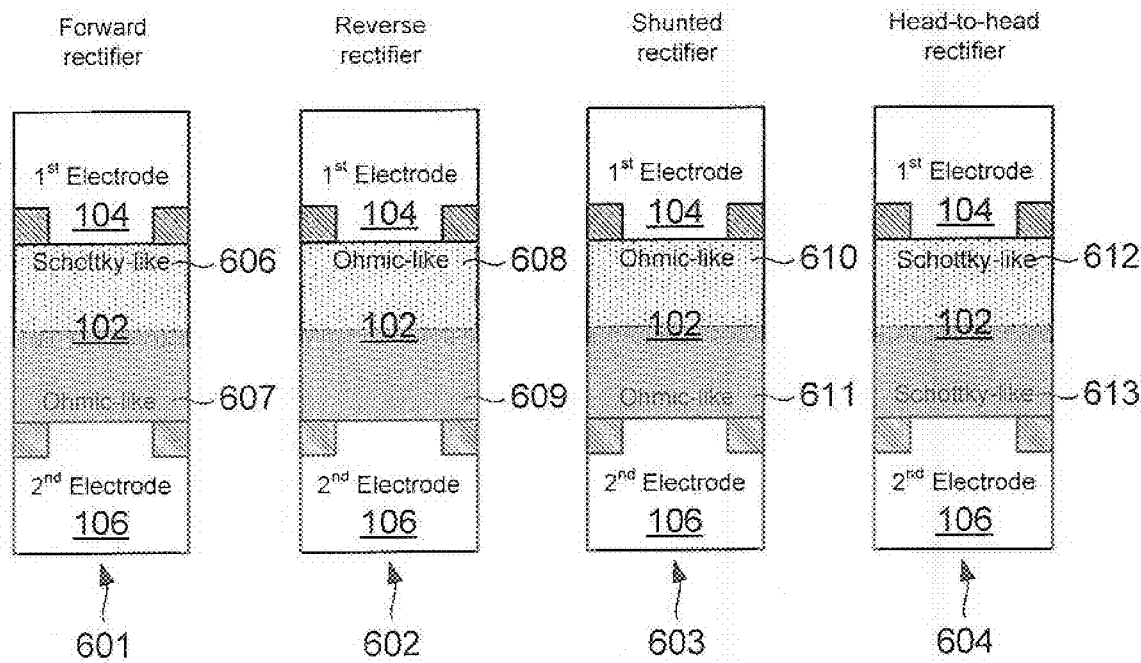
FIG. 6 shows the relative locations of the Ohmic-like and Schottky-like barriers associated four rectifiers formed in a heterostructure active region of a memristor device in accordance with embodiments of the present invention.

The semiconductor materials can be selected to form heterostructure active regions and electrodes providing a large engineering space from which memristor devices can be fabricated. FIG. 6 shows the relative locations of the Ohmic-like and Schottky-like barriers associated with each of the four rectifiers 601-604 in a memristor device with a heterostructure active region of a memristor device in accordance with embodiments of the present invention. Lightly shaded region 606 represents a first semiconductor layer composed of a first semiconductor material and darkly shaded region 607 represents a second semiconductor layer composed of a second semiconductor material. Unlike the rectifiers, described above with reference to FIG. 5, the different semiconductor materials have different. Schottky-like and Ohmic-like barriers with metallic electrodes. For example, the Ohmic-like barrier 607 of the forward rectifier 601 may be higher and wider than the Ohmic-like barrier 608 of the reverse rectifier 602. The Schottky-like barrier 609 of the reverse rectifier 602 may be higher and wider than the Schottky-like barrier 606 of the forward rectifier 601. In addition, the Ohmic-like barrier 610 can be higher and wider than the Ohmic-like barrier 611. Finally, the two Schottky-like barriers 612 may be higher and wider than the Schottky-like barrier 613. Heterojunctions formed between different semiconductor layers of an active region can also affect the flow of charge carriers through a memristor device. The semiconductor materials forming a heterojunction typically have unequal band gaps, and the semiconductor materials can be selected to form different types of heterojunctions.

B. Bulk Switching

Figure 7:
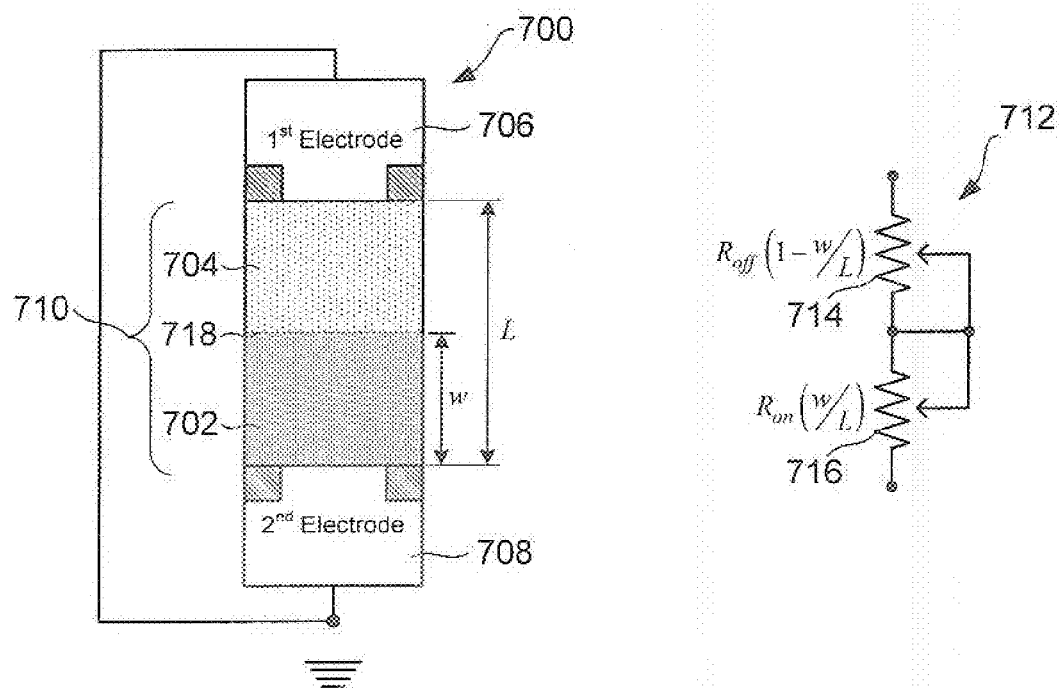
FIG. 7 shows a schematic, representation of a memristor device used in bulk switching and configured in accordance with embodiments of the present invention.

Unlike interface switching, in bulk switching, there is no, or relatively little, electronic barrier at the active region/electrode interface. In other words, interface resistance is negligible and bulk resistance dominates. Embodiments of the present invention include selecting the semiconductor and dopant materials for the active region in order to form an active resistor with two sub-regions, each sub-region having a different resistance in series. FIG. 7 shows a schematic representation of a memristor device 700 used in bulk switching and configured in accordance with embodiments of the present invention. The device 700 includes a doped semiconductor region 702 and a substantially undoped semiconductor region 704. The regions 702 and 704 are sandwiched between a first electrode 706 and a second electrode 708 and form an active region 710 that can be composed of a single semiconductor or a combination of two or more semiconductor layers, as described above in subsection II. The thickness of the active region 710 is denoted by L and w is a state variable that specifies the distribution of dopants in the active region 710. It is proposed that resistance switching and charge transport within the device 700 is a hysteresis requiring an atomic rearrangement of dopants with the active region 710 that modulates the electronic current. The total resistance of the device 700 is determined by two variable resistors connected in series, where the resistances are given for the full length L of the device 700. In particular, the doped region 702 has a relatively low resistance $R_{on}$, and because the region 704 has a low or substantially zero dopant concentration, the region 704 has a relatively higher resistance $R_{off}$. FIG. 7 also includes a circuit diagram 712 with a first resistor 714 and a second resistor 716 in series. First, resistor 714 represents the substantially undoped region 704 and has a relatively higher resistance than the second resistor 716 representing the doped region 702.

Application of an external bias voltage v(t) across the device 700 moves the boundary 718 between the two regions 702 and 704 by causing the charged dopants to drift into the undoped region 704. For example, in the case of Ohmic electronic conduction and linear ionic drift in a uniform field with average ion mobility $\mu_v$ gives:

$$v(t) = \left(R_{on}\frac{w(t)}{L} + R_{off}\left(1 - \frac{w(t)}{L}\right)\right)i(t)$$

and $$\frac{dw(t)}{dt} = \mu_V \frac{R_{on}}{L} i(t)$$

which yields the following:

$$w(t) = \mu_V \frac{R_{on}}{L} q(t)$$

where w ranges from 0 to L. Substituting w(t) into v(t) and taking $R_{on} \square R_{off}$ gives:

$$M(q) = R_{off}\left(1 - \frac{\mu_V R_{on}}{L^2} q(t)\right)$$

The time-dependent charge q(t) is the contribution to the memristance and it becomes larger in absolute value for relatively higher dopant mobilities $\mu_v$ and smaller L. In particular, for any material, q(t) pre-factor is approximately 1,000,000 times larger in absolute value at the nanometer scale, because of the factor $1/L^2$, and the memristance is correspondingly more significant. Thus, memristance becomes more important for understanding the electronic characteristics of any device 700 as the dimensions shrink to the nanometer scale.

Figures 8, 9:
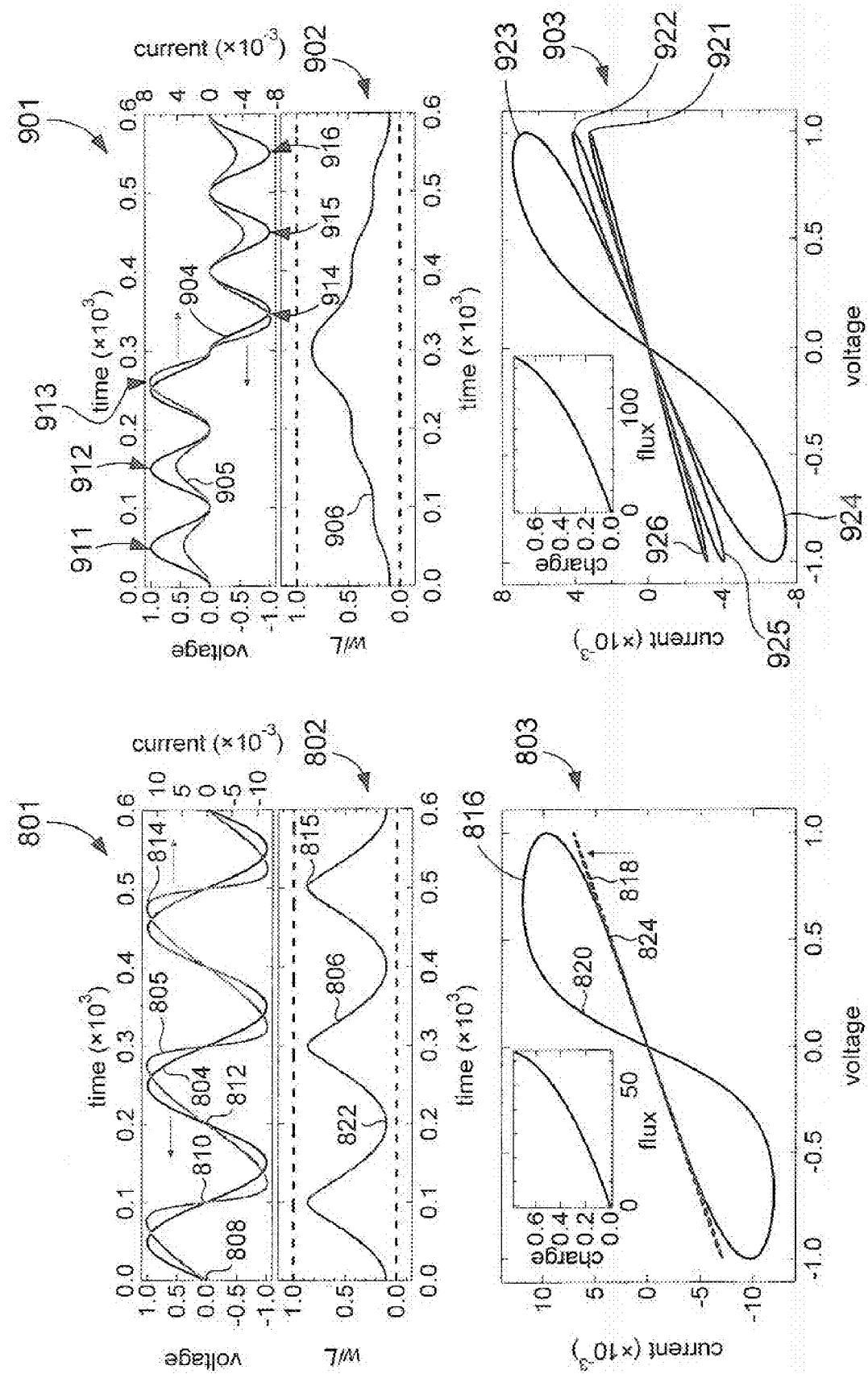
FIG. 8 shows plots of a first applied voltage, resulting current, and I-V hysteresis for a memristor device operated in accordance with embodiments of the present invention.
FIG. 9 shows plots of a second applied voltage, resulting current, and I-V hysteresis for a memristor device operated in accordance with embodiments of the present invention.

The state variable w is proportional to the charge g that passes through the device 700 until its value approaches L. This is the condition of "hard" switching characterized by large voltage excursions or long times under bias voltage. FIG. 8 shows a first plot 801 of an applied voltage and resulting current versus time, a second plot 802 of the ratio of w/L versus time, and a plot 803 of I-V hysteresis for the device 700 operated in accordance with embodiments of the present invention. In plot 801, an applied voltage curve 804, representing $v_0 \sin(\omega_0 t)$, represents an oscillating bias voltage applied the device 700 where $v_o$ is the magnitude of the applied bias voltage and rib is the frequency, and curve 805 represents the resulting current flowing, through the device 700 with a resistance ratio $R_{on}/R_{off}=160$. In plots 801-803, the axes are dimensionless, with voltage, current, time, flux, and charge expressed in units of $v_0=1V$, $i_0=v_0/R_{on}=10$ mA, $t_0 2\pi=2\pi/\omega_0=L^2/\mu_V v_0=10$ ms, where $i_0$ denotes the maximum possible current through the device 700, and $t_0$ is the shortest time required for linear drift of dopants across the full device 700 length in a uniform field $v_0/L$, for example with L=10 nm and $\mu_V=10^{-10}$ cm$^2$s$^{-1}$V$^{-1}$.

Plots 801 and 802 reveal how the ratio w/L 806 and the resulting current 805 flowing through the device 700 respond to the oscillating applied bias voltage 804. For example, while the applied voltage is positive, such as between point 808 and 810, w/L curve 806 reveals that w increases. In other words, the doped region 702 expands because an electric field associated with the applied voltage causes dopants to drift into the shrinking undoped region 704. In contrast, when the polarity of the applied voltage reverses between point 810 and 812, the doped region 702 retracts because the field associated with the reverse polarity causes dopants to drift in the opposite direction expanding the undoped region 704. Curves 805 and 806 reveal how the amplitude of the current flowing through the device 700 changes with w. For example, current curve 805 reveals that the resulting current approaches a maximum amplitude (negative or positive), such as point 814, when w approaches a maximum, as indicated by point 815, and the current goes to zero when w approaches a minimum. Note that, for the parameters selected, the applied bias never forces either of the two resistive regions to collapse. For example, curve 806 shows that w/L does not approach zero or one. Plot 803 shows two I-V hysteresis curves 816 and 818. Relatively steep positively sloped portion 820 of curve 816 corresponds to minima, such as minimum 822, of x/L curve 806, and gentle, positively sloped portion 824 corresponds to maxima, such as maximum 812, of x/L curve 806. As long as the device 800 remains in the memristor regime, any symmetrical alternating-current voltage bias results in double-loop I-V hysteresis that collapses to a straight line for high frequencies. In particular, the collapsed I-V hysteresis identified by straight line 818 is observed for a 10 fold increase in the frequency of the applied bias voltage.

FIG. 9 shows a first plot 901 of an applied voltage and resulting current versus time, a second plot 902 of the ratio of w/L versus time, and a plot 903 of I-V hysteresis for the device 700 operated in accordance with embodiments of the present invention. In plot 901, an applied voltage curve 904 is $\pm v_0 \sin^2(\omega_0 t)$, and curve 1005 represents the resulting current flowing through the device 700 with a resistance ratio $R_{on}/R_{off}=380$. The axes are also dimensionless with voltage, current, time, flux, and charge characterized as described above with reference to FIG. 10. Curve 906 represents the ratio of w/L associated with curves 904 and 905. Successive waves 911-916 correspond to loops 921-926 of I-V hysteresis curves, shown in plot 903, indicate that multiple continuous states are obtained when there is any sort of asymmetry in the applied bias.

IV. Nanowire Implementations

Figure 10:
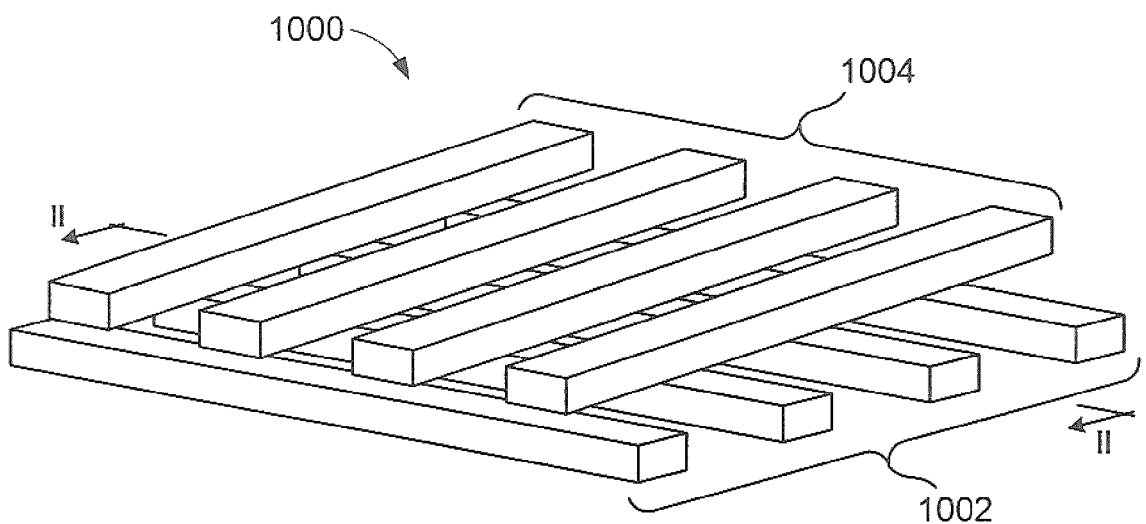
FIG. 10 shows an isometric view of a nanowire crossbar array configured in accordance with embodiments of the present invention.

The memristor devices described above in subsections I-III can be implemented at nanowire intersections of nanowire crossbar arrays. FIG. 10 shows an isometric view of a nanowire crossbar array 1000 configured in accordance with embodiments of the present invention. The crossbar array 1000 is composed of a first layer of approximately parallel nanowires 1002 that are overlain by a second layer of approximately parallel nanowires 1004. The nanowires of the second layer 1004 are approximately perpendicular, in orientation, to the nanowires of the first layer 1002, although the orientation angle between the layers may vary. The two layers of nanowires form a lattice, or crossbar; each nanowire of the second layer 1004 overlying all of the nanowires of the first layer 1002 and coming into close contact with each nanowire of the first layer 1002 at nanowire intersections called "crossbar junctions" that represent the closest contact between two nanowires. Although individual nanowires in FIG. 10 are shown with rectangular cross sections, nanowires can also have square, circular, elliptical, or more complex cross sections. The nanowires may also have many different widths or diameters and aspect ratios or eccentricities. The term "nanowire crossbar" may refer to crossbars having one or more layers of sub-microscale wires, microscale wires, or wires with larger dimensions, in addition to nanowires.

Figure 11:
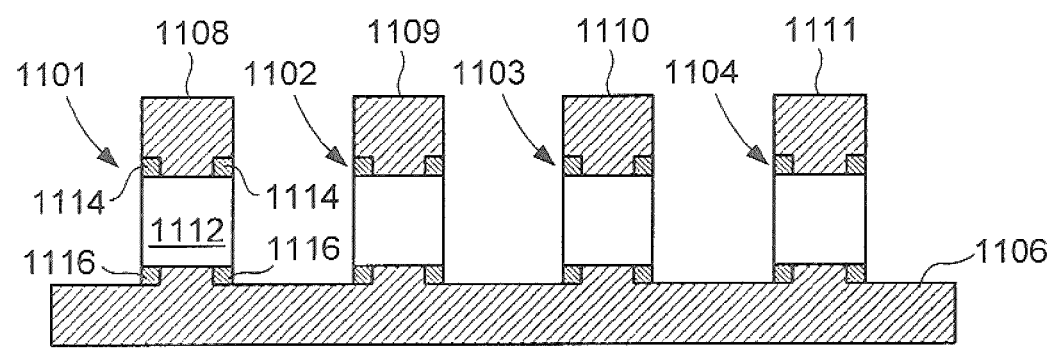
FIG. 11 shows a cross-sectional view of the crossbar array along a nanowire in the first layer, represented by line II-II shown in FIG. 10, configured with memristor devices in accordance with embodiments of the present invention.

FIG. 11 shows a cross-sectional view of the crossbar array 1000 along a nanowire in the first layer 1002, represented by line II-II shown in FIG. 10, configured in accordance with embodiments of the present invention. As shown in the example of FIG. 11, four separate memristor devices 1101-1104 are formed at crossbar junctions between a nanowire 1106 in the first layer 1002 and the four nanowires 1108-1111 of the second layer 1004. Each memristor device includes an active region sandwiched between one of the nanowires 1108-1111 and the nanowire 1106 as described above with reference to FIG. 1B. For example, memristor device 1101 includes an active region 1112 sandwiched between a portion of nanowire 1108 and a portion of nanowire 1106. As shown in the example of FIG. 11, the memristor device 1101 includes an insulation element 1114 with an opening through which a portion of the nanowire 1108 contacts the active region 1112 and an insulation element 1116 with an opening through which a portion of the nanowire 1106 contacts the active region 1112.

V. Memristor Device Fabrication

Figure 12A:
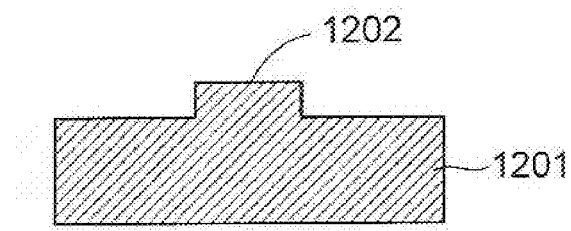
FIGS. 12A-12E show cross-sectional views of a memristor device in various fabrication stages associated with a method for fabricating the memristor device in accordance with embodiments of the present invention.

FIGS. 12A-12E show cross-sectional views of the memristor device, shown in FIG. 1B, in various fabrication stages in accordance with embodiments of the present invention. Initially, as shown in FIG. 12A, a first electrode 1201 can be formed on a substrate (not shown) using chemical vapor deposition ("CVD"), evaporation, sputtering, atom layer deposition ("ALD"), or wafer bonding. The layer 1201 can be further processed to form a nanowire with protrusion 1202 using lithography, such as nanoimprint lithography ("NIL"), e-beam lithography ("EBL"), x-ray lithography, photolithography, focused ion beam lithography, extreme UV lithography ("EUVL").

Figure 12B:
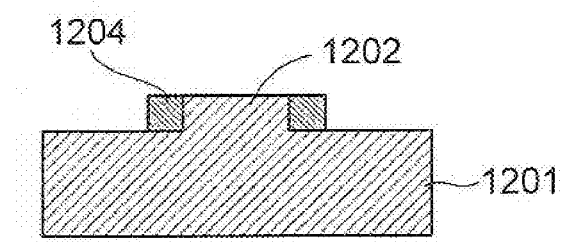

Next, as shown in FIG. 12B, a first insulation element 1204 can be deposited around the protrusion 1202 using CVD, sputtering, or another suitable technique for depositing the insulation material. The insulation element can be patterned using NIL, EBL or another suitable lithographic technique and planarized.

Figure 12C:
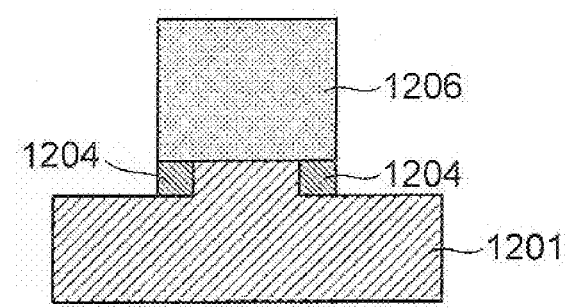

Next, as shown in FIG. 12C, an active region 1206 is formed using chemical vapor deposition ("CVD") or wafer bonding and can be patterned using EBL, x-ray lithography, photolithography, focused ion beam lithography, EUVL, or NIL.

Figure 12D:
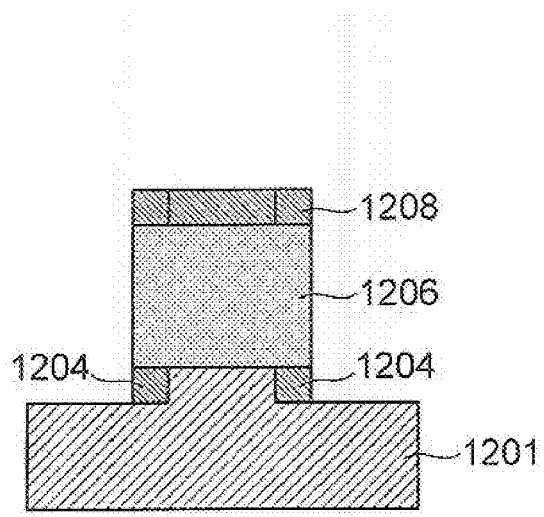
Figure 12E:
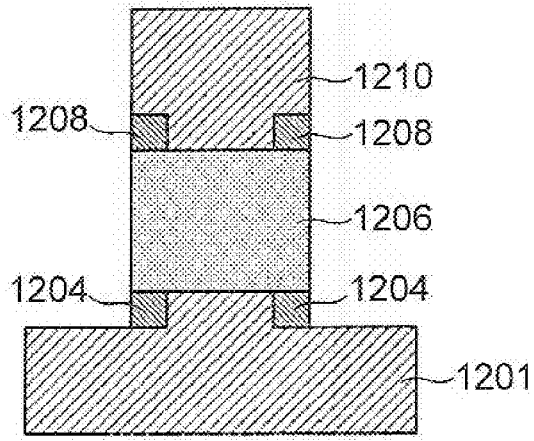

Next, as shown in FIG. 12D, a second insulation element 1208 can be deposited using CVD, sputtering, or another suitable technique for depositing the insulation material and patterned using NIL, EBL or another suitable lithographic technique and planarized.

Finally, a second electrode 1210 can be formed on the second insulation element using CVD, evaporation, sputtering, ALD, or wafer bonding. The electrode 1210 can shaped using a lithographic technique, including NIL, EBL, x-ray lithography; photolithography, focused ion beam lithography, or EUVL.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purposes of illustration and description. They are not intended to be exhaustive of or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A memristor device comprising:
an active region disposed between a first electrode and a second electrode;
a first insulation element disposed between the first electrode and an outer portion of a first surface of the active region, the first insulation element configured with one or more openings through which the first electrode makes physical contact with the active region; and
a second insulation element disposed between the second electrode and an outer portion of a second surface of the active region, the second insulation element configured with one or more openings through which the second electrode makes physical contact with the second surface.

2. The memristor of claim 1 wherein the first surface of the active region further comprises one or more protrusions that fit within the one or more openings of the first insulation element and establishes physical contact between the active region and the first electrode.

3. The memristor of claim 1 wherein the second surface of the active region further comprises one or more protrusions that fit within the one or more openings of the second insulation element and establishes physical contact between the active region and the second electrode.

4. The memristor of claim 1 wherein the first electrode further comprises one or more protrusions that fit within the one or more openings of the first insulation element and establishes physical contact between the active region and the first electrode.

5. The memristor of claim 1 wherein the second electrode further comprises one or more protrusions that fit within the one or more openings of the second insulation element and establishes physical contact between the active region and the second electrode.

6. The memristor of claim 1 wherein the one or more opening further comprises at least of one of: a square, a rectangle, a circle, an ellipse, an irregular shape, or any other suitable shape.

7. The memristor of claim 1 wherein the active region further comprise a primary active region and a secondary active region, wherein the secondary active region is a source of dopants for the primary active region.

8. The memristor of claim 1 wherein the first electrode and the second electrode are selected from a group consisting of platinum, gold, copper, tungsten, or any other suitable metal, metallic compound or semiconductor materials.

* * * * *